United States Patent
Deguchi

(10) Patent No.: US 10,660,244 B2
(45) Date of Patent: May 19, 2020

(54) SEMICONDUCTOR UNIT

(71) Applicant: TOYOTA JIDOSHA KABUSHIKI KAISHA, Toyota-shi, Aichi (JP)

(72) Inventor: Masataka Deguchi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/249,235

(22) Filed: Jan. 16, 2019

(65) Prior Publication Data
US 2019/0261539 A1 Aug. 22, 2019

(30) Foreign Application Priority Data
Feb. 21, 2018 (JP) ................. 2018-028809

(51) Int. Cl.
| | | |
|---|---|---|
| H05K 7/20 | (2006.01) | |
| H01L 23/28 | (2006.01) | |
| H01L 23/40 | (2006.01) | |
| H01L 23/42 | (2006.01) | |
| H01F 27/10 | (2006.01) | |
| H01F 27/24 | (2006.01) | |
| H01F 27/28 | (2006.01) | |
| H01L 23/473 | (2006.01) | |

(52) U.S. Cl.
CPC ..... *H05K 7/20927* (2013.01); *H01L 23/4012* (2013.01); *H01L 23/473* (2013.01); *H01L 23/40* (2013.01)

(58) Field of Classification Search
CPC ...... H05K 7/20; H05K 7/20927; H01L 23/28; H01L 23/40; H01L 23/42; H01F 27/10; H01F 27/24; H01F 27/28

USPC ....... 361/699, 689, 691, 701, 702, 715, 716, 361/728; 336/58; 363/141; 1/1
See application file for complete search history.

(56) References Cited

U.S. PATENT DOCUMENTS

| | | | |
|---|---|---|---|
| 5,426,949 A * | 6/1995 | Saho ................ | B01J 3/006 62/51.1 |
| 8,885,344 B2 * | 11/2014 | Asakura ............ | H01L 23/4006 165/80.2 |
| 2005/0259402 A1 * | 11/2005 | Yasui ................ | H02M 7/003 361/716 |
| 2007/0295715 A1 * | 12/2007 | Saka ................ | H01F 27/22 219/624 |
| 2008/0239663 A1 * | 10/2008 | Yamamoto ........ | H01L 23/473 361/691 |

(Continued)

FOREIGN PATENT DOCUMENTS

| | | | |
|---|---|---|---|
| JP | 2014-099488 A | 5/2014 | |
| JP | 2019-024054 A | 2/2019 | |

*Primary Examiner* — Xiaoliang Chen
(74) *Attorney, Agent, or Firm* — Oliff PLC

(57) ABSTRACT

A semiconductor unit may include first coolers arranged in parallel; semiconductor modules, each of the semiconductor modules being interposed between a pair of the first coolers arranged adjacently; a coolant discharge pipe provided at one of the first coolers that is located at an end of a stack of the first coolers and the semiconductor modules, the coolant discharge pipe extending along a stacking direction of the first coolers and the semiconductor modules; a second cooler connected with the coolant discharge pipe; and a reactor interposed between the second cooler and the one of the first coolers located at the end of the stack.

7 Claims, 4 Drawing Sheets

(56) References Cited

U.S. PATENT DOCUMENTS

| | | | | |
|---|---|---|---|---|
| 2009/0201708 A1* | 8/2009 | Ohkouchi | H01L 25/18 363/132 |
| 2013/0070502 A1* | 3/2013 | Suzuki | H02M 7/003 363/131 |
| 2013/0115537 A1* | 5/2013 | Chung | H01M 8/0637 429/423 |
| 2014/0092663 A1* | 4/2014 | Shimizu | H02M 7/003 363/141 |
| 2014/0198450 A1* | 7/2014 | Baba | H05K 9/0007 361/689 |
| 2014/0284028 A1* | 9/2014 | Yoshida | H01L 23/473 165/104.19 |
| 2014/0285969 A1* | 9/2014 | Kojima | H01G 2/14 361/689 |
| 2014/0290305 A1* | 10/2014 | Kunze | F25B 17/02 62/476 |
| 2014/0368145 A1* | 12/2014 | Miyachi | H02M 7/003 318/400.26 |
| 2015/0152987 A1* | 6/2015 | Ishikawa | F16L 5/12 285/350 |
| 2015/0189790 A1* | 7/2015 | Tachibana | H05K 7/20254 361/699 |
| 2015/0195957 A1* | 7/2015 | Ohoka | H05K 7/20927 361/702 |
| 2015/0289411 A1* | 10/2015 | Kamiya | H01L 25/071 361/701 |
| 2015/0357109 A1* | 12/2015 | Nobusaka | H01F 27/16 336/58 |
| 2016/0136749 A1* | 5/2016 | Lee | B23K 9/091 219/130.1 |
| 2016/0227677 A1* | 8/2016 | Hirasawa | H05K 7/20927 |
| 2016/0254206 A1* | 9/2016 | Ohno | H01L 23/31 363/132 |
| 2016/0374235 A1* | 12/2016 | Sakamoto | B60K 6/405 |
| 2018/0025961 A1* | 1/2018 | Momose | H01L 23/42 |
| 2018/0098457 A1* | 4/2018 | Takeuchi | H05K 7/20927 |
| 2019/0066899 A1* | 2/2019 | Sakamoto | H01F 27/10 |

\* cited by examiner

SEMICONDUCTOR UNIT

CROSS-REFERENCE TO RELATED APPLICATION

This application claims priority to Japanese Patent Application No. 2018-028809 filed on Feb. 21, 2018, the contents of which are hereby incorporated by reference into the present application.

TECHNICAL FIELD

The teaching disclosed herein relates to a semiconductor unit in which semiconductor modules and coolers are integrated.

BACKGROUND

Japanese Patent Application Publication No. 2014-99488 describes a semiconductor unit in which semiconductor modules, a reactor, and coolers are integrated. First coolers are arranged in parallel. Each of the semiconductor modules is interposed between a pair of the first coolers arranged adjacently. The first coolers have coolant passages therein, respectively. The adjacent first coolers are connected via connection pipes. A second cooler is located to face one of the first coolers that is located at one end of a stack of the first coolers and the semiconductor modules. The reactor is interposed between the second cooler and the one of the first coolers at the one end of the stack. The one of the first coolers at the one end of the stack and the second cooler are connected via connection pipes on both sides of the reactor. A coolant supply inlet and a coolant discharge outlet are provided in the second cooler. A coolant supplied to the second cooler firstly cools the reactor and then flows to the first coolers to cool the semiconductor modules.

SUMMARY

In the semiconductor unit described in Japanese Patent Application Publication No. 2014-99488, the reactor is cooled first, and the semiconductor modules are cooled thereafter. Due to this, cooling efficiency for the semiconductor modules cannot be said as being sufficient. The disclosure herein relates to a semiconductor unit including semiconductor modules, a reactor and coolers, and discloses a structure that improves cooling efficiency for the semiconductor modules.

A semiconductor unit disclosed herein may comprise semiconductor modules, first coolers, a reactor, a second cooler, and a coolant discharge pipe. The first coolers may be arranged in parallel. Each of the semiconductor modules may be interposed between a pair of the first coolers arranged adjacently. The coolant discharge pipe may be provided at one of the first coolers that is located at an end of a stack of the semiconductor modules and the first coolers. The coolant discharge pipe may extend along a stacking direction of the semiconductor modules and the first coolers. The second cooler may be connected with the coolant discharge pipe. The reactor may be interposed between the second cooler and the one of the first coolers located at the end of the stack. In the semiconductor unit disclosed herein, the reactor is cooled by a coolant discharged from the first coolers. That is, the semiconductor modules are cooled before the reactor is. Due to this, as compared to the semiconductor unit of Japanese Patent Application Publication No. 2014-99488, cooling efficiency for the semiconductor modules is improved.

The semiconductor unit disclosed herein may further comprise another reactor and a third cooler. The third cooler may be connected with the second cooler. The other reactor may be interposed between the second cooler and the third cooler. This semiconductor unit is capable of cooling the plurality of reactors.

In a case where the second cooler is located at an end, a voltage converter may contact a side of the second cooler opposite from the reactor. Alternatively, in a case where the third cooler is located at the end, a voltage converter may contact a side of the third cooler opposite from the reactor. Such semiconductor unit can cool the voltage converter in addition to the semiconductor modules and the reactor.

The second cooler may be configured separately from the first coolers. Manufacture of the semiconductor unit becomes easier as compared to a case where the second cooler is fabricated integrally with the first coolers.

Details and further improvements of the teaching disclosed herein will be described in the detailed description below.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor units.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

Figure 1:
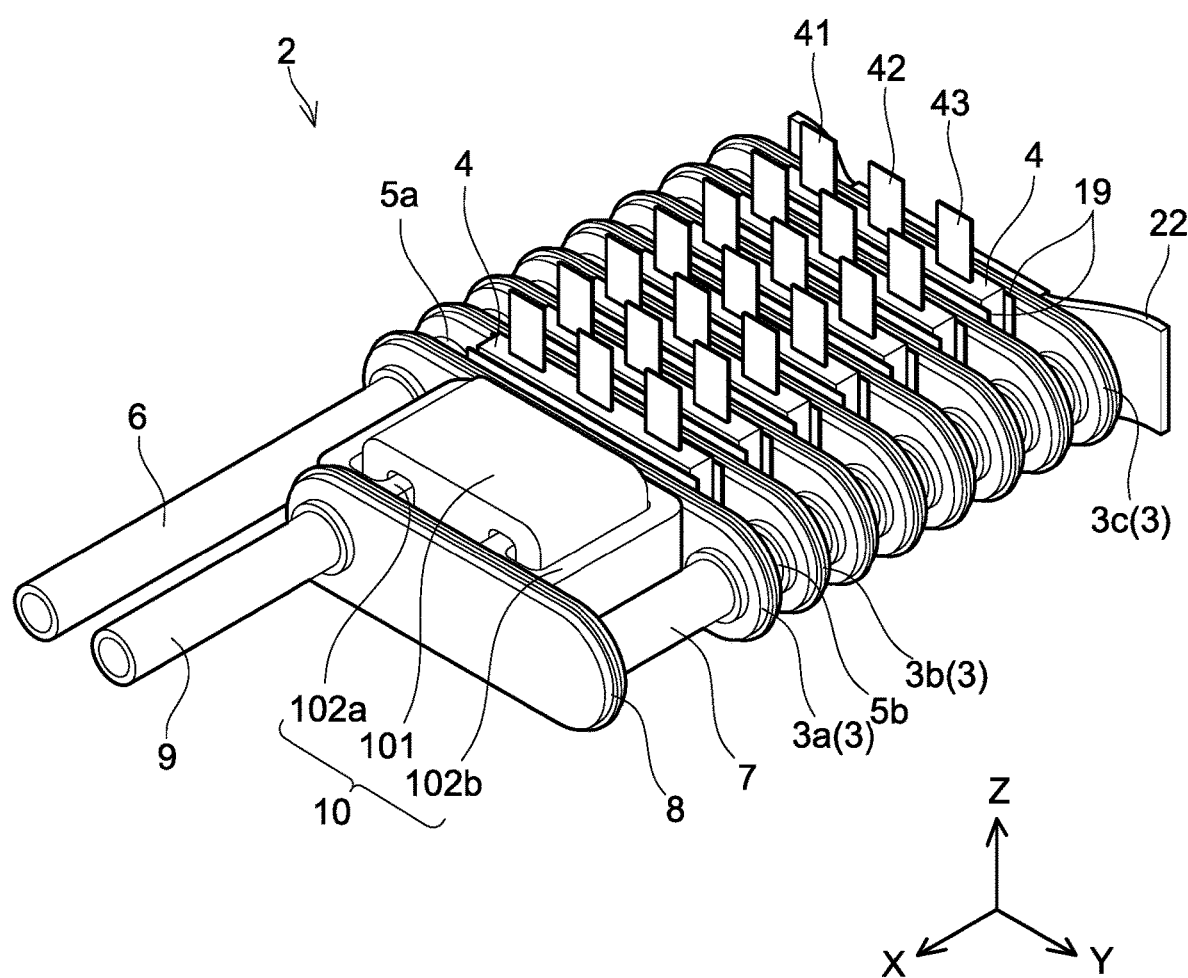
FIG. 1 is a perspective view of a semiconductor unit according to a first embodiment.
Figure 2:
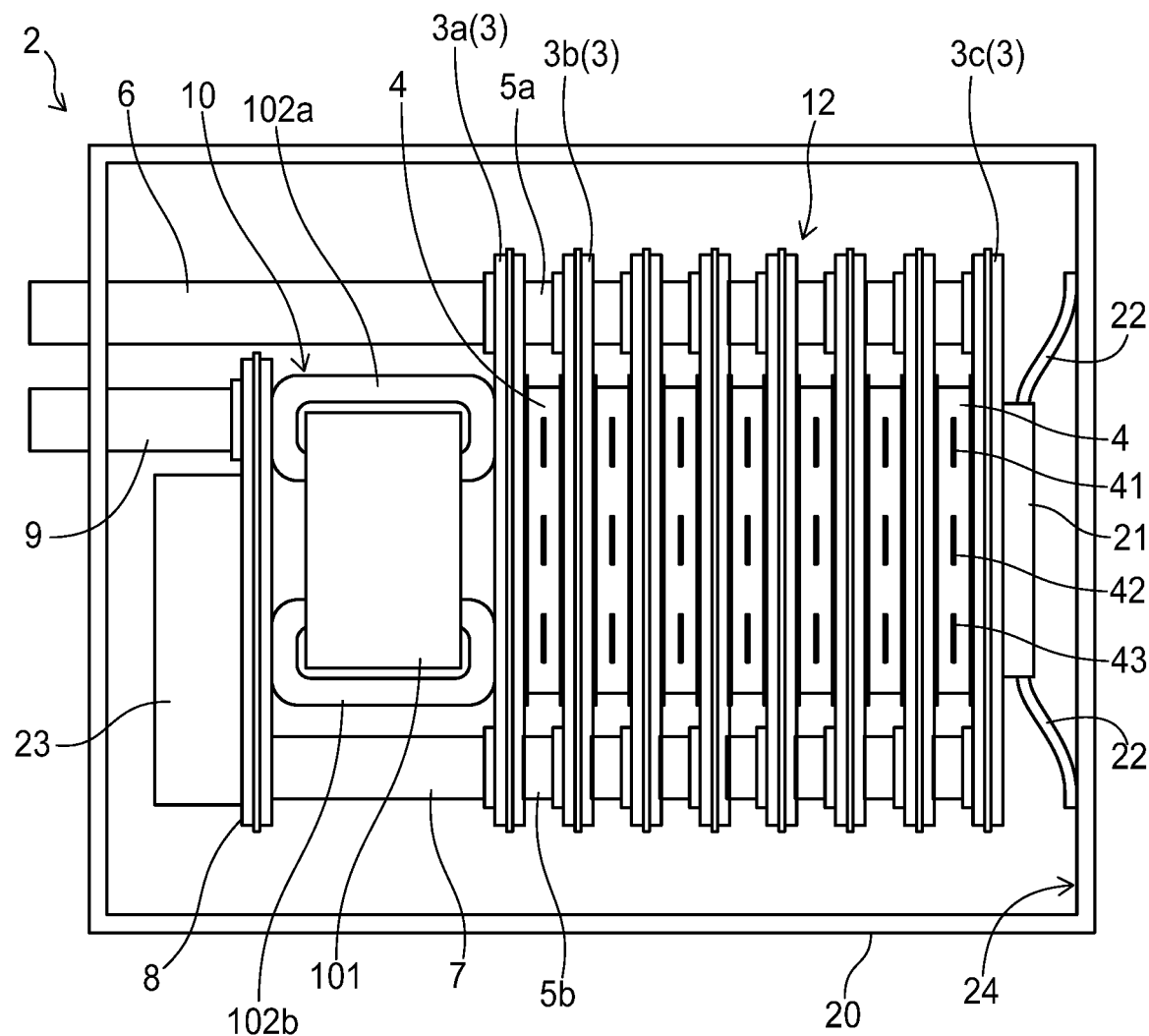
FIG. 2 is a plan view of the semiconductor unit according to the first embodiment.

A semiconductor unit 2 according to a first embodiment will be described with reference to FIGS. 1 and 2. FIG. 1 shows a perspective view of the semiconductor unit 2. FIG. 2 is a plan view of the semiconductor unit 2. In FIG. 2, the semiconductor unit 2 is housed in a casing 20.

The semiconductor unit 2 includes a plurality of first coolers 3, a plurality of semiconductor modules 4, a reactor 10, a second cooler 8, and a coolant discharge pipe 7. In FIGS. 1 and 2, reference signs 3a to 3c are given to three of the first coolers, and reference sings are omitted for the rest of the first coolers. When one of the first coolers is to be indicated without any distinction from the rest thereof, it will be denoted as "the first cooler 3". In FIGS. 1 and 2, a reference sign 4 is given to only two of the semiconductor modules, and the reference sing is omitted for the rest of the semiconductor modules.

Each first cooler 3 is a flat and hollow container, and includes a passage through which a coolant flows. The first coolers 3 are arranged in parallel with their widest surfaces facing each other. One of the semiconductor modules 4 is interposed between a pair of the first coolers 3a, 3b arranged adjacently. Each semiconductor module 4 is interposed between a pair of the first coolers 3 arranged adjacently.

Each of the semiconductor modules 4 is a device in which two switching elements are embedded. Each semiconductor module 4 is of a card type and is arranged with its widest surfaces facing the first coolers 3. Power terminals 41, 42, 43 extend from one narrow width surface of each semiconductor module 4, and control terminals (not shown) extend from a narrow width surface opposite to the one narrow surface. In each semiconductor module 4, the two switching elements are connected in series, with a positive side of the serial connection electrically connected with the power terminal 41, a negative side thereof electrically connected with the power terminal 42, and an intermediate point thereof electrically connected with the power terminal 43. The control terminals include gate terminals electrically connected with gate electrodes of the switching elements, and terminals connected with sense emitter electrodes.

The adjacent first coolers 3a, 3b are connected via connection pipes 5a, 5b. In FIG. 1, reference signs 5a, 5b are given only to the connection pipes between the first coolers 3a, 3b, and the reference signs are omitted for connection pipes between other pairs of adjacent first coolers 3. The connection pipes 5a, 5b are located on both sides of the semiconductor modules 4 respectively, as seen along a stacking direction of the first coolers 3 and the semiconductor modules 4. An X direction in a coordinate system in the drawing corresponds to the stacking direction. The X direction corresponds to the stacking direction in the other drawings as well. The plurality of connection pipes 5a is arranged in line along the stacking direction. The plurality of connection pipes 5b is also arranged in line along the stacking direction. A coolant supply pipe 6 and the coolant discharge pipe 7 are connected to the first cooler 3a located at one end of a stack 12 of the first coolers 3 and the semiconductor modules 4 in the stacking direction. The coolant supply pipe 6 is located to align with the connection pipes 5a in the stacking direction. The coolant discharge pipe 7 is located to align with the plurality of connection pipes 5b in the stacking direction. An insulation plate 19 is interposed between each of the adjacent semiconductor modules 4 and its corresponding first coolers 3. In FIG. 2, a reference sign is not given to the insulation plates.

One end of the coolant supply pipe 6 penetrates the casing 20 and opens outside the casing 20. One end of the coolant discharge pipe 7 is connected with the second cooler 8. The second cooler 8 has a final discharge pipe 9 connected therewith. One end of the final discharge pipe 9 penetrates the casing 20 and opens outside the casing 20. The coolant supply pipe 6 and the final discharge pipe 9 are connected with a coolant circulation device which is not shown. The coolant is supplied from the coolant circulation device to the semiconductor unit 2 through the coolant supply pipe 6. The coolant having passed through the first coolers 3 and the second cooler 8 is discharged from the semiconductor unit 2 through the final discharge pipe 9, and returns to the coolant circulation device. The coolant may be, for example, water or anti-freeze solution.

The coolant supplied through the coolant supply pipe 6 is distributed to all the first coolers 3 through the plurality of connection pipes 5a. The coolant cools the semiconductor modules 4 while flowing through the first coolers 3 adjacent thereto. The coolant having passed through the first coolers 3 flows to the coolant discharge pipe 7 through the plurality of connection pipes 5b.

The second cooler 8 is connected with one end (a coolant outlet) of the coolant discharge pipe 7. The second cooler 8 also has a coolant passage therein similarly to the first coolers 3. A length of the second cooler 8 in a Y direction in the coordinate system of the drawing is shorter than that of the first coolers 3. The final discharge pipe 9 is connected to the second cooler 8. In the Y direction in the coordinate system of the drawing, the coolant discharge pipe 7 is connected to one end of the second cooler 8 and the final discharge pipe 9 is connected to another end thereof. The coolant having flown from the first coolers 3 through the coolant discharge pipe 7 passes through inside of the second cooler 8 and is discharged to outside through the final discharge pipe 9.

The reactor 10 is interposed between the first cooler 3a at the one end of the stack 12 and the second cooler 8. The reactor 10 includes a core 101 and two coils 102a, 102b wound on the core 101. Side surfaces of the coils 102a, 102b contact the first cooler 3a and the second cooler 8. Insulation sheets may be interposed between the respective coils 102a, 102b and the first cooler 3a and the second cooler 8. Alternatively, the coils 102a, 102b may be given insulating coating.

The coolant having flown through the plurality of first coolers 3 flows to the second cooler 8 through the coolant discharge pipe 7. The reactor 10 is cooled by the first cooler 3a at the one end of the stack 12 and by the second cooler 8. The coolant having flown through the second cooler 8 is discharged from the semiconductor unit 2 through the final discharge pipe 9.

The coolant having flown through the first cooler 3a at the one end of the stack 12 does not flow to the other first coolers 3. Due to this, the plurality of semiconductor modules 4 is cooled without being affected by heat from the reactor 10. The semiconductor unit 2 can prioritize cooling of the semiconductor modules 4.

The semiconductor unit 2 is housed in the casing 20. The semiconductor unit 2 is interposed between an inner wall 24 and a support post 23 of the casing 20 within the casing 20. The semiconductor unit 2 is supported at both ends of the stack 12 in the stacking direction. The second cooler 8, which corresponds to one end of the semiconductor unit 2, contacts the support post 23 of the casing 20. A pressurizing plate 21 is interposed between the first cooler 3c at another end of the stack 12, which corresponds to another end of the semiconductor unit 2, and the inner wall 24. A plate spring 22 is incorporated in the pressurizing plate 21. The plate spring 22 contacts the inner wall 24 of the casing 20. The plate spring 22 is compressed between the inner wall 24 and the semiconductor unit 2. The plate spring 22 pressurizes the semiconductor unit 2 in the stacking direction of the stack 12 (the X direction in the drawings). The semiconductor modules 4 and the first coolers 3 are brought tightly in contact with each other by pressurization by the plate spring 22, by which heat transfer from the semiconductor modules 4 to the first coolers 3 is enhanced. Further, the pressurization by the plate spring 22 brings the reactor 10 and the first cooler 3a into tight contact, by which the reactor 10 and the second cooler 8 are brought into tight contact as well. Since the reactor 10, the first cooler 3a, and the second cooler 8 are brought into tight contact, heat transfer from the reactor 10 to the first cooler 3a and the second cooler 8 is thereby enhanced.

Second Embodiment

Figure 3:
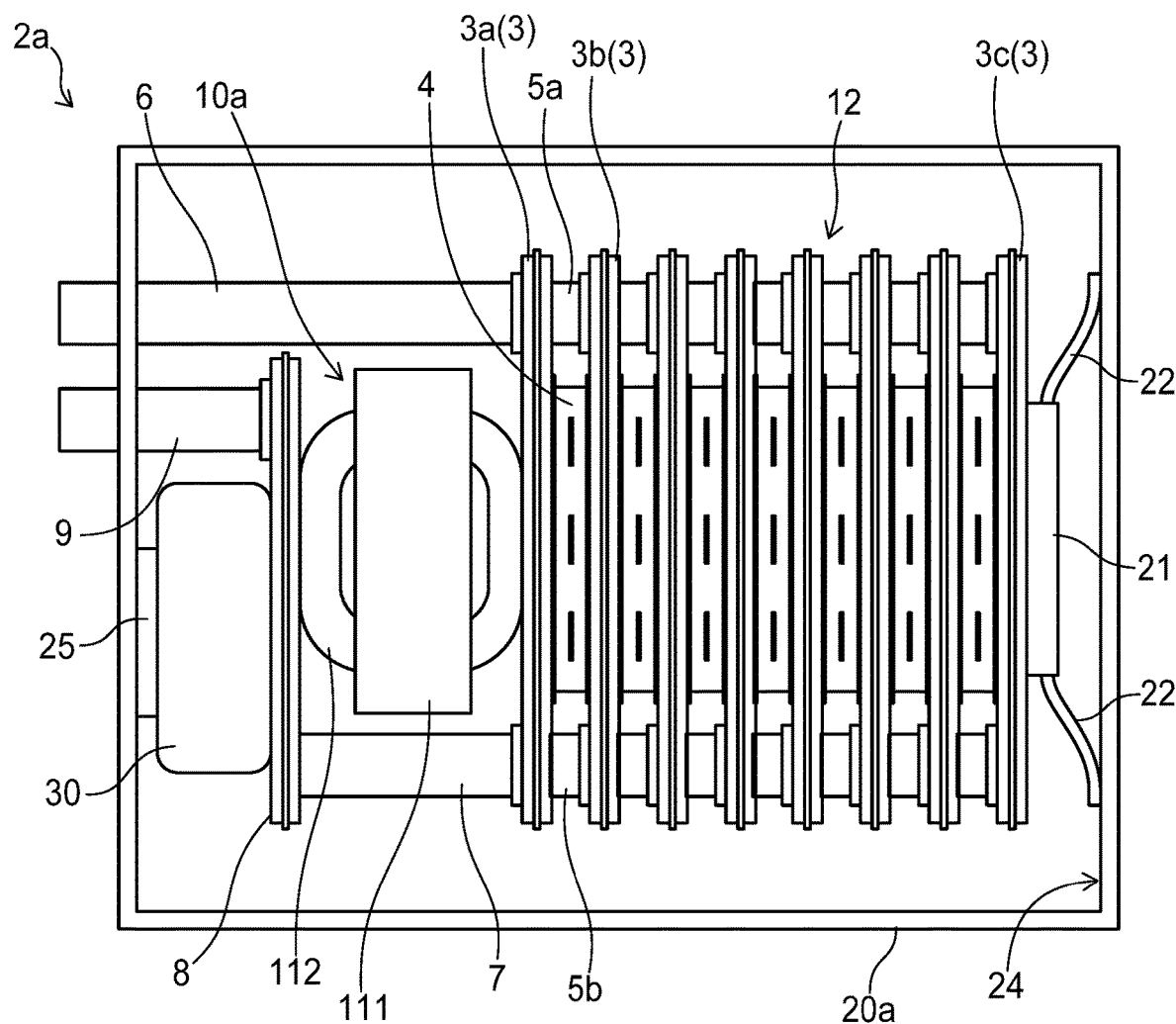
FIG. 3 is a plan view of a semiconductor unit according to a second embodiment.

A semiconductor unit 2a according to a second embodiment will be described with reference to FIG. 3. FIG. 3 is a plan view of the semiconductor unit 2a housed in a casing 20a. The semiconductor unit 2a differs from the semiconductor unit 2 of the first embodiment in that a voltage converter 30 is provided. Further, in the semiconductor unit 2a, a shape of a reactor 10a is different from that of the reactor 10 of the semiconductor unit 2 of the first embodiment. Since configurations other than the voltage converter 30 and the reactor 10a are same as those of the semiconductor unit 2 of the first embodiment, descriptions thereof will be omitted.

The reactor 10a is interposed between the first cooler 3a at the one end of the stack 12 and the second cooler 8. The reactor 10a is a single coil type in which one coil 112 is wound on a core 111. The coil 112 contacts the first cooler 3a and the second cooler 8. Insulation sheets may be interposed between the coil 112 and the first cooler 3a and the second cooler 8. Alternatively, the coil 112 may be given insulating coating.

The voltage converter 30 contacts the second cooler 8 at an opposite side from the reactor 10a. The voltage converter 30 is cooled by the second cooler 8. A side of the voltage converter 30 on an opposite side from the second cooler 8 contacts a support post 25. The semiconductor unit 2a is housed between the support post 25 and the inner wall 24 of the casing 20a, and the pressurizing plate 21 provided with the plate spring 22 is inserted between the inner wall 24 and the semiconductor unit 2a. The semiconductor unit 2a is pressurized by the plate spring 22 in the stacking direction. The pressurization by the plate spring 22 brings the first coolers 3 and the semiconductor modules 4 into tight contact. Further, the reactor 10a, the first cooler 3a, and the second cooler 8 are thereby brought into tight contact. Moreover, the second cooler 8 and the voltage converter 30 are brought into tight contact as well.

The semiconductor unit 2a of the second embodiment can further cool the voltage converter 30 in addition to the semiconductor modules 4 and the reactor 10a. The coolant discharged from the plurality of first coolers 3 flows through the second cooler 8 that cools the voltage converter 30. Due to this, heat from the voltage converter 30 does not deteriorate cooling efficiency for the semiconductor modules 4.

Third Embodiment

Figure 4:
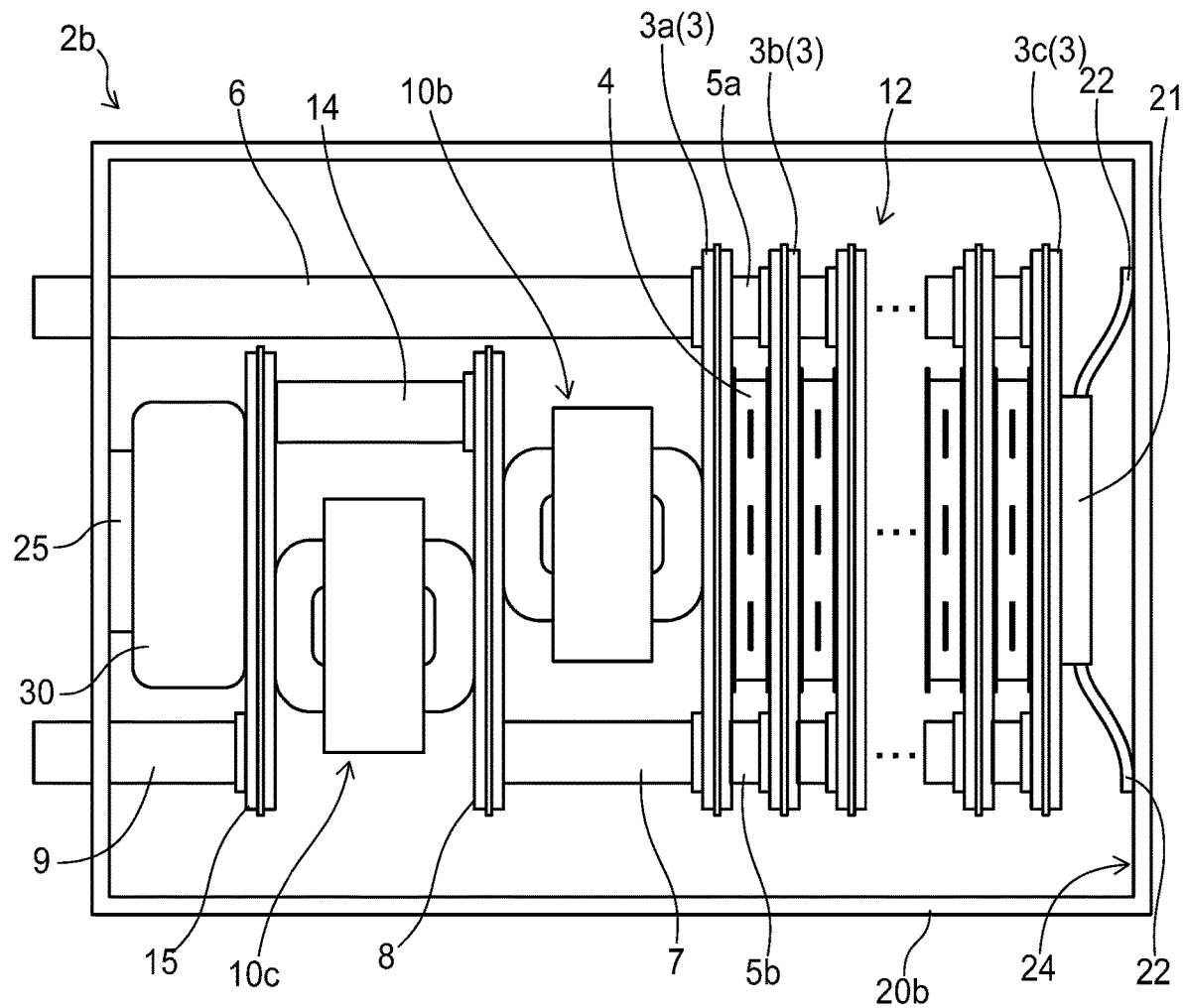
FIG. 4 is a plan view of a semiconductor unit according to a third embodiment.

A semiconductor unit 2b according to a third embodiment will be described with reference to FIG. 4. FIG. 4 is a plan view of the semiconductor unit 2b housed in a casing 20b. The semiconductor unit 2b differs from the semiconductor unit 2a of the second embodiment in that two reactors 10b, 10c are provided. The stack 12 is same as the stack 12 of the first and second embodiments, however, a center portion thereof in the stacking direction is omitted in FIG. 4.

The semiconductor unit 2b includes the two reactors 10b, 10c, the voltage converter 30, the second cooler 8, and a third cooler 15 in addition to the stack 12 of the semiconductor modules 4 and the first coolers 3. The coolant discharge pipe 7 extends in the stacking direction (the X direction) from the first cooler 3a at the one end of the stack 12, and the second cooler 8 is connected with this coolant discharge pipe 7. The coolant discharge pipe 7 is connected with one end of the second cooler 8 in the Y direction. A second coolant discharge pipe 14 extends in the X direction from another end of the second cooler 8. The third cooler 15 is connected with the second coolant discharge pipe 14. The second coolant discharge pipe 14 is connected with one end of the third cooler 15 in the Y direction. The final discharge pipe 9 is connected with another end of the third cooler 15. The final discharge pipe 9 penetrates the casing 20b.

The reactor 10b is interposed between the first cooler 3a at the one end of the stack 12 and the second cooler 8, and the other reactor 10c is interposed between the second cooler 8 and the third cooler 15. The reactors 10b, 10c are each the single coil type similarly to the reactor 10a of the second embodiment. The voltage converter 30 contacts the third cooler 15 as well.

A side of the voltage converter 30 opposite from the third cooler 15 contacts the support post 25. The semiconductor unit 2b is housed between the support post 25 and the inner wall 24 of the casing 20b, and the pressurizing plate 21 provided with the plate spring 22 is inserted between the inner wall 24 and the semiconductor unit 2b. Similarly to the semiconductor unit 2a of the second embodiment, the plate spring 22 brings the respective coolers and the reactors 10b, 10c into tight contact, by which the third cooler 15 and the voltage converter 30 are brought into tight contact.

The coolant discharged from the second cooler 8 flows through the third cooler 15. Due to this, heat from the reactors 10b, 10c and the voltage converter 30 does not affect cooling of the semiconductor modules 4. In the semiconductor unit 2b of the third embodiment as well, the semiconductor modules 4 are cooled with priority over the reactors 10b, 10c and the voltage converter 30.

The coolant flows inside the first cooler 3a in a positive Y direction in the coordinate system of the drawings. The coolant flows inside the second cooler 8 in a negative Y direction. Further, the coolant flows inside the third cooler 15 in the positive Y direction. The coolant flows in opposite directions on both sides of the reactor 10b. The coolant flows in opposite directions on both sides of the reactor 10c.

Some features of the teachings described in the embodiments will be described. The second cooler 8 is configured separately from the first coolers 3. Due to this, manufacture is easier as compared to a case where the second cooler 8 is fabricated integrally with the first coolers 3.

The first coolers 3 and the connection pipes 5a, 5b are connected by brazing or welding. The coolant supply pipe 6, the coolant discharge pipe 7, the final discharge pipe 9, and the second coolant discharge pipe 14 are also connected with their corresponding coolers by brazing or welding.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor unit comprising:
   first coolers arranged in parallel;
   semiconductor modules, each of the semiconductor modules being interposed between a pair of the first coolers arranged adjacently;
   a coolant discharge pipe provided at one of the first coolers that is located at an end of a stack of the first coolers and the semiconductor modules, the coolant discharge pipe extending along a stacking direction of the first coolers and the semiconductor modules;
   a second cooler connected with the coolant discharge pipe;
   a reactor interposed between the second cooler and the one of the first coolers located at the end of the stack;
   a third cooler connected with the second cooler; and
   another reactor interposed between the second cooler and the third cooler.

2. The semiconductor unit of claim 1, further comprising a voltage converter contacting the third cooler.

3. The semiconductor unit of claim 1, further comprising a voltage converter contacting the second cooler.

4. The semiconductor unit of claim 1, wherein the second cooler is configured separately from the first coolers.

5. The semiconductor unit of claim 1, further comprising:
   a coolant supply pipe provided at the one of the first coolers that is located at the end of the stack; and
   connection pipes, each of pairs of the connection pipes connecting each of pairs of the first coolers arranged adjacently;
   wherein:
   the connection pipes are located on both sides of the semiconductor modules; and
   a half of the connection pipes are arranged in line along the stacking direction at one side of the semiconductor modules and another half of the connection pipes are arranged in line along the stacking direction at another side of the semiconductor modules;
   the coolant supply pipe is located to align with the half of the connection pipes in the stacking direction; and
   the coolant discharge pipe is located to align with the another half of the connection pipes in the stacking direction.

6. The semiconductor unit of claim 1, wherein the coolant discharge pipe is connected at one end of the second cooler and another coolant discharge pipe is connected at another end of the second cooler.

7. The semiconductor unit of claim 6, wherein a flow direction of coolant in the one of the first coolers that is located at the end of the stack and a flow direction of the coolant in the second cooler are opposite each other.

* * * * *